United States Patent
Guo et al.

(10) Patent No.: US 10,533,439 B2
(45) Date of Patent: Jan. 14, 2020

(54) GAS TURBINE ENGINE COMPONENT WITH ABRASIVE SURFACE FORMED BY ELECTRICAL DISCHARGE MACHINING

(71) Applicant: UNITED TECHNOLOGIES CORPORATION, Farmington, CT (US)

(72) Inventors: Changsheng Guo, South Windsor, CT (US); Christopher W. Strock, Kennebunk, ME (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 651 days.

(21) Appl. No.: 14/934,458

(22) Filed: Nov. 6, 2015

(65) Prior Publication Data
US 2016/0169013 A1 Jun. 16, 2016

Related U.S. Application Data

(60) Provisional application No. 62/092,585, filed on Dec. 16, 2014.

(51) Int. Cl.
*F01D 9/04* (2006.01)
*F01D 11/00* (2006.01)
(Continued)

(52) U.S. Cl.
CPC .............. *F01D 9/041* (2013.01); *B23H 1/10* (2013.01); *C23C 16/0263* (2013.01);
(Continued)

(58) Field of Classification Search
CPC ... F01D 9/041; F01D 5/20; F01D 5/28; F01D 5/288; F01D 11/001; F01D 11/12;
(Continued)

(56) References Cited

U.S. PATENT DOCUMENTS 4,995,949 A * 2/1991 Rhoades ............... B23H 9/02
138/44
5,651,901 A 7/1997 Mohri et al.
(Continued)

FOREIGN PATENT DOCUMENTS

EP 1645659 A1 4/2006
EP 1645723 A1 4/2006
(Continued)

OTHER PUBLICATIONS

English Abstract for WO2004111304A1—Dec. 23, 2004; 2 pgs.
(Continued)

*Primary Examiner* — Aaron R Eastman
(74) *Attorney, Agent, or Firm* — Cantor Colburn LLP

(57) ABSTRACT

A component for a gas turbine engine is described. The component may comprise a body portion formed from a metallic material. The component may further comprise an abrasive surface forming at least one surface of the body portion, and the abrasive surface may be configured to abrade an abradable material. The abrasive surface may be formed from electrical discharge machining of the metallic material.

18 Claims, 5 Drawing Sheets

(51) Int. Cl.
- *F16J 15/3204* (2016.01)
- *C23C 16/02* (2006.01)
- *F16J 15/328* (2016.01)
- *C23C 16/34* (2006.01)
- *C23C 16/27* (2006.01)
- *C23C 16/56* (2006.01)
- *C23C 28/04* (2006.01)
- *B23H 1/10* (2006.01)
- *C25D 11/04* (2006.01)

(52) U.S. Cl.
CPC .............. *C23C 16/27* (2013.01); *C23C 16/34* (2013.01); *C23C 16/56* (2013.01); *C23C 28/046* (2013.01); *C25D 11/04* (2013.01); *F01D 11/001* (2013.01); *F16J 15/3204* (2013.01); *F16J 15/328* (2013.01); *F05D 2220/32* (2013.01); *F05D 2230/12* (2013.01); *F05D 2230/314* (2013.01); *F05D 2230/90* (2013.01); *F05D 2240/121* (2013.01); *F05D 2240/125* (2013.01); *F05D 2300/173* (2013.01); *F05D 2300/174* (2013.01); *F05D 2300/177* (2013.01); *F05D 2300/224* (2013.01); *F05D 2300/611* (2013.01)

(58) Field of Classification Search
CPC .......... F01D 11/08; F01D 11/122; F01D 5/02; F01D 25/24
See application file for complete search history.

(56) References Cited

U.S. PATENT DOCUMENTS

| | | | | |
|---|---|---|---|---|
| 6,159,618 | A | * | 12/2000 | Danroc .................... C23C 28/02 428/472 |
| 2003/0183529 | A1 | | 10/2003 | Ohara et al. |
| 2007/0160469 | A1 | | 7/2007 | Ochiai et al. |
| 2011/0014060 | A1 | * | 1/2011 | Bolcavage .............. F01D 5/288 416/241 R |
| 2011/0027573 | A1 | * | 2/2011 | Strock ........................ C23C 4/04 428/319.1 |
| 2011/0165433 | A1 | * | 7/2011 | Pabla .................. C23C 18/1651 428/615 |
| 2013/0122259 | A1 | * | 5/2013 | Lee .......................... C23C 30/00 428/164 |

FOREIGN PATENT DOCUMENTS

| WO | 2004111304 A1 | 12/2004 |
|---|---|---|
| WO | 2004111394 A1 | 12/2004 |

OTHER PUBLICATIONS

English Abstract for WO2004111394A1—Dec. 23, 2004; 2 pgs.
European Search Report for Application No. 15200552.6-1610; dated May 23, 2016; 7 pgs.

* cited by examiner

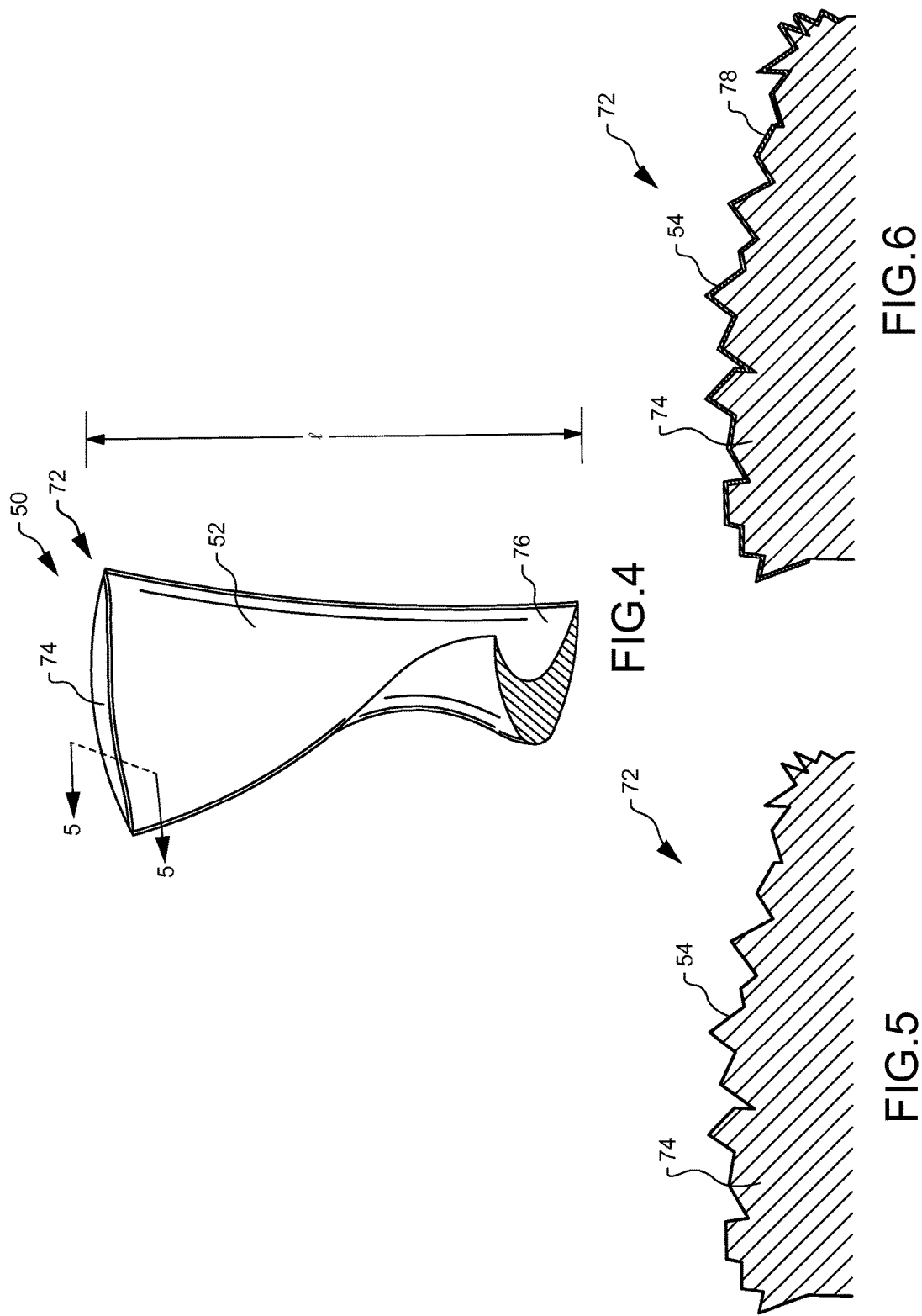

GAS TURBINE ENGINE COMPONENT WITH ABRASIVE SURFACE FORMED BY ELECTRICAL DISCHARGE MACHINING

CROSS-REFERENCE TO RELATED APPLICATIONS

This patent application claims priority under the 35 USC § 119(e) to U.S. Provisional Patent Application Ser. No. 62/092,585, filed on Dec. 16, 2014.

FIELD OF THE DISCLOSURE

The present disclosure generally relates to gas turbine engines, and more specifically, to components in gas turbine engines having abrasive surfaces.

BACKGROUND

Gas turbine engines, such as those used to provide thrust to an aircraft, are internal combustion engines that use air as the working fluid. In general, gas turbine engines may include a fan section and a core engine located downstream of the fan section. In operation, air may be drawn into the engine and accelerated by the fan section, and a fraction of the indrawn air may be routed through the core engine where the air may be combusted with fuel to provide energy to drive the engine and provide forward thrust to an associated aircraft, or power if used in land based operations. In an upstream to downstream order, the core engine may include a compressor section, one or more combustors, a turbine section, and an exhaust nozzle.

The fan section, the compressor section, and the turbine section may each include rotating airfoils (e.g., blades). The overall efficiency of gas turbine engines may be dependent on the formation of a tight seal between the tips of the blades and an abradable seal radially outward of the blade tips. The seal may be established by allowing the tips of the blades to cut into or abrade the abradable seal, thereby preventing air/gas from leaking past the blade tip. In particular, the blade tips may cut the seal to match the rotation path of the blade tips.

Blade tips in gas turbine engines may have a rough, abrasive surface to promote effective cutting into the abradable material. Alternatively, they may have a hard, wear-resistant coating such as an alumina or a zirconia coating. Current gas turbine engine designs may employ cubic boron nitride (CBN) particles to create a rough surface on the tips of the blades due to the favorable cutting properties of CBN. For example, U.S. Pat. No. 5,704,759 describes the attachment of CBN particles to the tips of compressor blades via an entrapment electroplating process. Similarly, U.S. Patent Application Publication Number 2005/0129511 describes turbine blade tips having abrasive coatings that include a mixture of CBN particles and silicon nitride ($Si_3N_4$) particles. Other prior art methods for producing abrasive tips on gas turbine engine blades may rely on brazing or thermal spray deposition.

While effective, current abrasive blade tips, such and CBN-based abrasive tips, may be expensive to manufacture. Furthermore, current methods for producing abrasive blade tips may require multiple steps including a grinding step to size the blade tips to length, followed by a thermal spray or plating process to apply the abrasive to a heavily masked blade.

Thus, there is a need for more cost-effective and efficient manufacturing methods for gas turbine engine parts having abrasive surfaces.

SUMMARY

In accordance with one aspect of the present disclosure, a component for a gas turbine engine is disclosed. The component may comprise a body portion formed from a metallic material, and an abrasive surface along at least one surface of the body portion that is configured to abrade an abradable material. The abrasive surface may be formed from electrical discharge machining of the metallic material.

In another refinement, the abrasive surface may have an average roughness of between about 0.01 millimeters and about 0.7 millimeters.

In another refinement, the component may be an airfoil, and the abrasive surface may be along a tip of the airfoil.

In another refinement, the tip may exhibit a contact area with the abradable material of less than about 20%.

In another refinement, the contact area may be between about 5% and about 10%.

In another refinement, the metallic material may be selected from the group consisting of a nickel alloy, an aluminum alloy, and an iron alloy.

In another refinement, the component may further comprise a hard coating applied to the abrasive surface, and the hard coating may have a thickness less than the average roughness of the abrasive surface.

In another refinement, the hard coating may be applied by chemical vapor deposition.

In another refinement, the hard coating may be a titanium nitride coating.

In another refinement, the hard coating may be a diamond-like carbon coating.

In another refinement, the metallic material may include aluminum, and the hard coating may be an aluminum oxide coating formed by anodizing the abrasive surface.

In another refinement, the component may be knife edge of a knife edge seal, and the abrasive surface may form a cutting edge of the knife edge.

In another refinement, the component may be a cantilever vane, and the abrasive surface may form a radially inward facing edge of the cantilever vane.

In accordance with another aspect of the present disclosure, an assembly for a gas turbine engine is disclosed. The assembly may comprise at least one of a compressor section, a combustor, or a turbine section. The assembly may further comprise an airfoil in the at least one fan section, compressor section, or turbine section. The airfoil may include a body portion formed from a metallic material, and a tip configured to abrade an abradable material. The tip may have an abrasive surface formed from electrical discharge machining of the metallic material.

In accordance with another aspect of the present disclosure, a method for fabricating an airfoil for a gas turbine engine is disclosed. The method may comprise providing a body portion of the airfoil, wherein the body portion includes a tip and is formed from a metallic material. The method may further comprise machining the metallic material of the tip by electrical discharge machining to adjust a length of the airfoil and to form an abrasive surface on the tip.

In another refinement, the method may further comprise adjusting at least one electrode discharge machining parameter to provide a desired roughness of the abrasive surface.

In another refinement, the at least one parameter may be selected from voltage and current density.

In another refinement, the method may further comprise applying a hard coating to the abrasive surface.

In another refinement, the hard coating may be selected from a titanium nitride coating and a diamond-like coating.

In another refinement, the method may further comprise anodizing the abrasive surface to provide a hard coating on the abrasive surface.

These and other aspects and features of the present disclosure will be more readily understood when read in conjunction with the accompanying drawings.

BRIEF DESCRIPTION OF THE DRAWINGS

FIG. 4 is perspective view of an airfoil of the gas turbine engine, constructed in accordance with the present disclosure.

FIG. 5 is a cross-sectional view through the section 5-5 of FIG. 4, illustrating an abrasive surface on a tip of the airfoil, constructed in accordance with the present disclosure.

FIG. 6 is a cross-sectional view similar to FIG. 5, but having a hard coating applied to the abrasive surface.

It should be understood that the drawings are not necessarily drawn to scale and that the disclosed embodiments are sometimes illustrated schematically and in partial views. It is to be further appreciated that the following detailed description is merely exemplary in nature and is not intended to limit the disclosure or the application and uses thereof. In this regard, it is to be additionally appreciated that the described embodiments are not limited to use with the exemplary gas turbine engine airfoils described herein. Hence, although the present disclosure is, for convenience of explanation, depicted and described as certain illustrative embodiments, it will be appreciated that it can be implemented in various other types of embodiments and in various other systems and environments.

DETAILED DESCRIPTION

Figure 1:
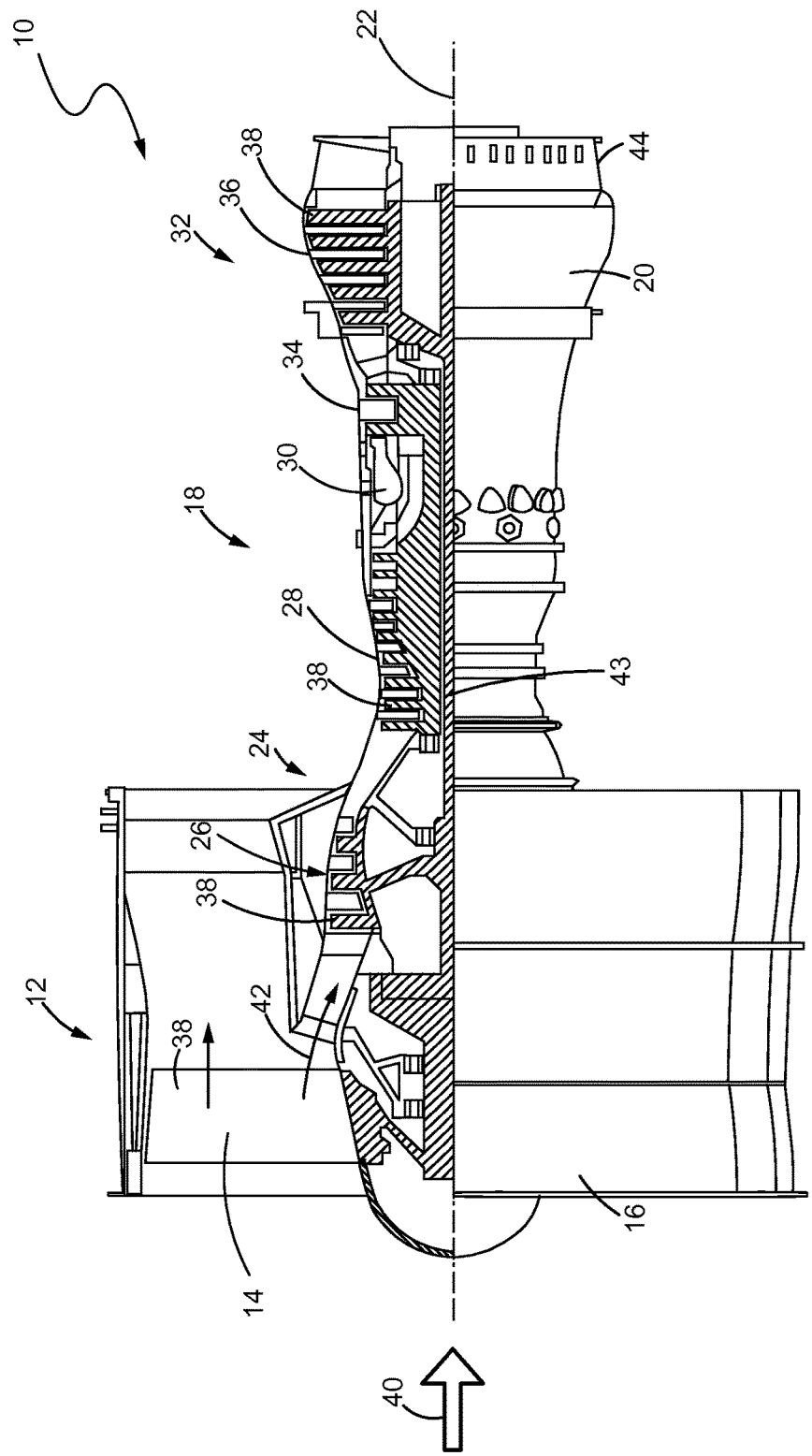
FIG. 1 is a cross-sectional view of a gas turbine engine, constructed in accordance with the present disclosure.
Figure 3:
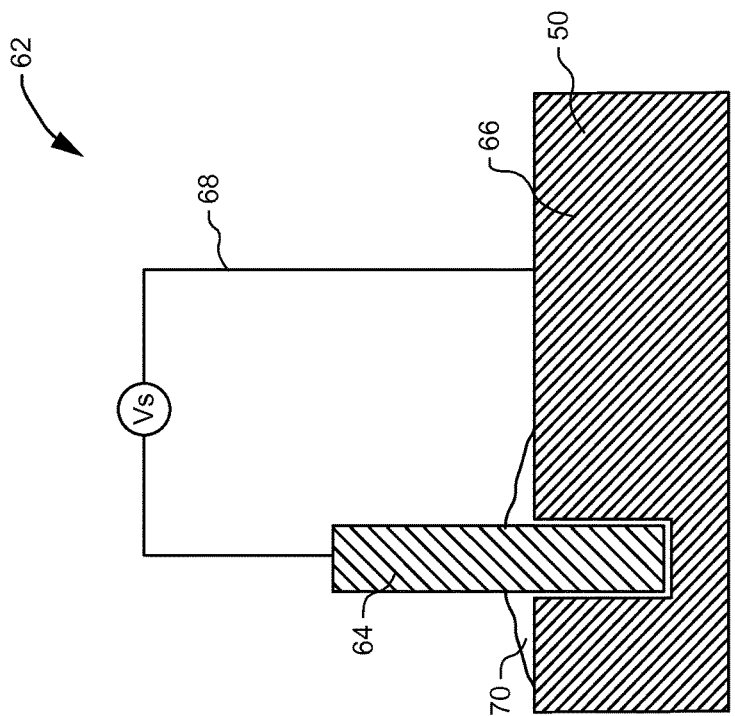
FIG. 3 is a schematic view of an electrical discharge machining set-up that may be used to produce an abrasive surface on a gas turbine engine component, in accordance with the present disclosure.

Referring now to the drawings, and with specific reference to FIG. 1, an exemplary gas turbine engine 10 is shown. The gas turbine engine 10 may be associated with an aircraft to provide thrust, or it may be used to provide power in other applications. The gas turbine engine 10 may include a fan section 12 having a fan 14 surrounded by a fan case 16, as well as a core engine 18 that is surrounded by an engine case 20 and located axially downstream of the fan 14 with respect to an engine central axis 22. In an upstream to downstream direction, the core engine 18 may include: a compressor section 24 which may include a low pressure compressor (LPC) 26 upstream from a high pressure compressor (HPC) 28, one or more combustors 30, and a turbine section 32 which may include a high pressure turbine (HPT) 34 upstream from a low pressure turbine (LPT) 36. In addition, the fan section 12, the compressor section 24, and the turbine section 32 may each include one or more rotor assemblies 38 having rotatable airfoils (or blades). Although the gas turbine engine 10 is shown as a two spool turbofan engine, it will be understood that the engine 10 may have other architectures as well, such as a three-spool turbofan with an intermediate pressure compressor section and an intermediate pressure turbine section, and that such other architectures of the engine 10, as well as various other types of gas turbine engines, may be utilized in accordance with the various embodiments of the present disclosure.

In operation, air 40 may be drawn into the engine 10 and it may be accelerated by the rotating blades of the fan 14. After passing through the fan section 12, a fraction of the indrawn air 40 may be routed through a primary flow pathway 42 defined by the core engine 18, as shown. In the primary flow pathway 42, the air 40 may first be compressed/pressurized in the LPC 26 and the HPC 28 of the compressor section 24, and it may then enter the combustor(s) 30 where it may be mixed with fuel and combusted to generate hot combustion gases. The hot combustion gases may then expand through and drive the rotation of the HPT 34 and the LPT 36 which may, in turn, drive the rotation of the fan 14 and the compressor section 24, as all may be interconnected through one or more common shafts 43. The gases may then be exhausted through an exhaust nozzle 44 to provide forward thrust to an associate aircraft.

Figure 2:
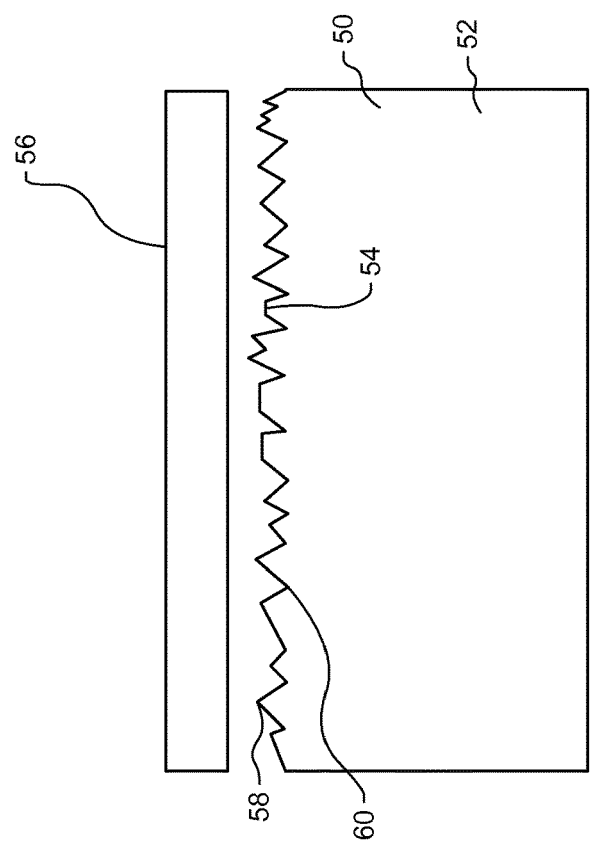
FIG. 2 is a schematic view of a component of the gas turbine engine having an abrasive surface, constructed in accordance with the present disclosure.

Turning now to FIG. 2, a component 50 of the gas turbine engine 10 is shown. Although depicted as a box-like structure, the component 50 may have any structure suitable for its intended purpose. The component 50 may have a body portion 52 which may be formed from a metallic material such as, but not limited to, a nickel alloy, an iron alloy, or an aluminum alloy. In addition, the component 50 may include at least one abrasive surface 54 along at least one surface of the body portion 52 which may be configured to abrade or cut into an abradable material 56. Furthermore, the abrasive surface 54 may include peaks 58 and valleys 60, the average distance between which may define an average roughness of the abrasive surface 54. In some cases, the average roughness of the abrasive surface 54 may range from between about 0.01 millimeters and about 0.7 millimeters, although it may extend beyond this range in some circumstances as well. In addition, the abrasive surface 54 may exhibit a contact area with the abradable material 56. In accordance with the present disclosure, the contact area of the abrasive surface is the percentage of the abrasive surface 54 that is involved in contacting the abradable material 56. In general, higher surface roughnesses may provide lower contact areas with the abradable material 56 which may, in turn, correlate with better cutting capabilities and lower frictional heat generation during rubbing with the abradable material 56.

The abrasive surface 54 may be formed by electrical discharge machining (EDM) of the metallic material of the body portion 52, as best shown in FIG. 2. Specifically, an EDM set-up 62 used to produce the abrasive surface 54 may generally include an electrode 64, a work-piece electrode 66 (which may be the component 50), a power supply 68, and a dielectric 70 in a gap between the electrode 64 and the work-piece electrode 66/component 50. When a pulse of DC electricity is supplied to the electrode 64 from the power supply 68, one or more heat-generating electrical discharges (or sparks) may develop in the dielectric 70 between the electrode 64 and the contacted surface of the component 50. The high temperature sparks may melt/vaporize and/or oxidize the contacted surface of the component 50. When the pulse ends, the spark(s) may collapse, leaving small un-even features of resolidified and/or oxidized metallic material along the contacted surface of the component 50, thereby providing the abrasive surface 54. The average roughness (and contact area) of the abrasive surface 54 may be tuned by varying the processing parameters of the electrical discharge machining set-up 62, such as, but not limited to, the voltage supplied by the power supply 68 and the current density (or current per unit area of the contacted surface of the component 50). In general, applicants have found an increase in average roughness of the resulting abrasive surface 54 with increasing voltage and increasing current density.

As may be appreciated, the electrical discharge machining process described above creates the abrasive surface 54 from the metallic material of the component 50. Thus, the resulting abrasive surface 54 may exhibit the same hardness and density as the metallic material (e.g., nickel alloy, iron alloy, aluminum alloy, etc.) of the component 50. This feature may lead to improved efficiencies for gas turbine engine applications in which the component 50 is involved in preventing air or gas leakage through the engine 10, as compared with more porous abrasive coatings of the prior art. In addition, as the electrode discharge machining process only takes place at the surface of the component 50 that is contacted with the electrode 64, it may be carried out efficiently without masking the other surfaces of the component 50.

In accordance with one aspect of the present disclosure, the component 50 may be an airfoil 72, as shown in FIG. 4. The airfoil 72 may be a rotating blade of a rotor 38 of one or more of the fan section 12, the compressor section 24, and the turbine section 32. In this regard, the body portion 52 of the airfoil 72 may be formed from a metallic material such as, but not limited to, a nickel alloy, an iron alloy, or an aluminum alloy. The body portion 52 of the airfoil 72 may include a tip 74 at its radially outward end, as well as a root portion 76 which may connect to or be integrally formed with a rotatable disk of the rotor 38 (as in an integrally bladed rotor). As best shown in FIG. 5, the tip 74 may have the abrasive surface 54 and it may be configured to cut into the abradable material 56 in order to prevent air or gas leakage through the gas turbine engine 10. For example, the abradable material 56 may line an inner surface of the fan case 16, or it may line an inner surface of an inner diameter shroud of the compressor section 24 or the turbine section 32.

The electrical discharge machining process described above may be used to both machine the length (l) of the airfoil 72 by machining down the tip 74, as well as produce the abrasive surface 54 on the tip 74. Moreover, as opposed to a non-treated smooth blade tip which may exhibit a contact area of 50% or more, the abrasive surface 54 of the tip 74 may exhibit a contact area with the abradable material 56 that is less than about 20%, such as between about 5% and about 10%. In particular, applicants have found that blade tip surfaces with lower contact areas (and higher roughnesses) exhibit better cutting/abrading capabilities as a result of higher local contact pressures. In addition, through modeling calculations, applicants have found that blade tip surfaces with lower contact areas (and lower contact forces) exhibit reduced contact temperatures at the contact interface between the blade tips and the abradable material. Accordingly, such reduced contact temperatures with blade tips with lower contact areas (and increased roughnesses) may advantageously protect metallic blades from heat-induced damage, such as material softening, in some cases.

Optionally, the airfoil 72 may further include a hard coating 78 applied to the abrasive surface 54 to improve the hardness and wear resistance of the tip 74. The hard coating 78 may have a thickness that is substantially less than the average roughness of the abrasive surface 54, such that the roughness character of the abrasive surface 54 is maintained at the surface of the tip 74. For example, the hard coating may have a thickness of between about 0.002 millimeters to about 0.05 millimeters, although the thickness may extend beyond this range in some cases as well. The hard coating 78 may be deposited by chemical vapor deposition, and it may include a ceramic material, such titanium nitride, or a diamond-like carbon material, although other types of hard coatings may be used as well. Alternatively, if the airfoil 72 is formed from an aluminum alloy, the hard coating 78 may be an aluminum oxide coating generated by anodizing the abrasive surface 54.

Figure 7:
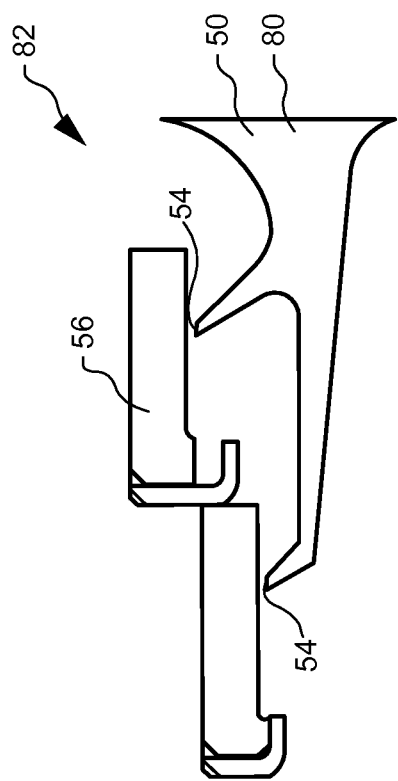
FIG. 7 is a cross-sectional view of a knife edge seal of the gas turbine engine, constructed in accordance with the present disclosure.

In another aspect of the present disclosure, the component 50 may be a knife edge 80 of a knife edge seal 82 of the gas turbine engine 10, as shown in FIG. 7. In this arrangement, the abrasive surface 54 may form a cutting edge that cuts or abrades a groove into the abradable material 56. Although well understood by those with ordinary skill in the art, the knife edge seal 82 may be involved in preventing air or gas leakage which may otherwise undermine the efficiency of the gas turbine engine 10. Similarly, the component 50 may be a plate seal of the gas turbine engine 10, in which the abrasive surface 54 may cut a groove into the abradable seal 56 to prevent air or gas leakage. Although apparent to those with ordinary skill in the art, a plate seal is similar to a knife edge seal, as shown in FIG. 7, but has a flat surface instead of a knife edge.

Figure 8:
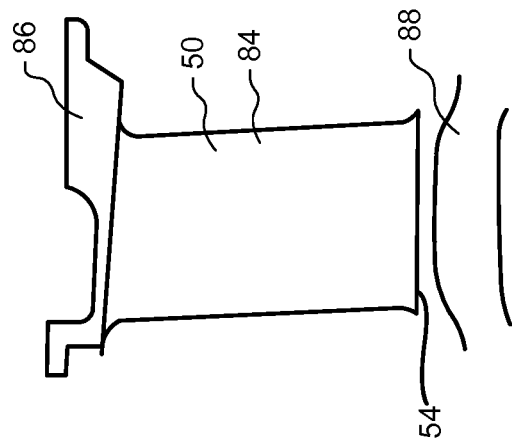
FIG. 8 is a cross-sectional view of a cantilever vane of the gas turbine engine, constructed in accordance with the present disclosure.

In another aspect of the present disclosure, the component 50 may be a non-rotating cantilever vane 84 of the gas turbine engine 10, as shown in FIG. 8. In this case, the cantilever vane 84 may extend radially inward from an outer shroud 86 towards a support structure 88, and the abrasive surface 54 may be the radially inward facing edge of the vane 84, as shown. In either aspect, the abrasive surfaces 54 may include a hard coating 78, and the roughnesses/contact areas of the abrasive surfaces 54 may be adjusted by tuning the EDM parameters as described above. However, it will be understood that the component 50 may be various other types of gas turbine engine components having abrasive surfaces, such as labyrinth seals.

Figure 9:
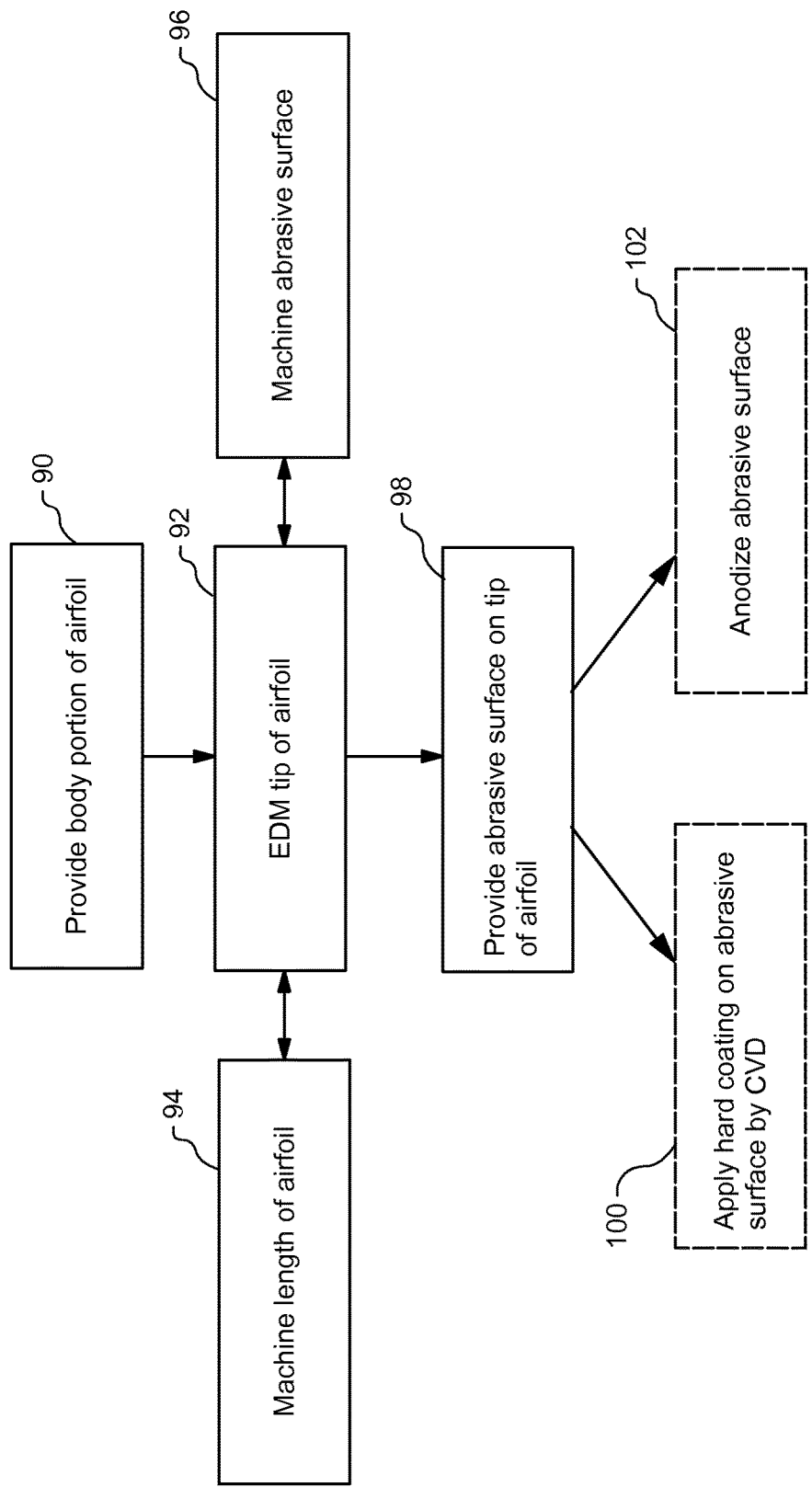
FIG. 9 is a flowchart illustrating a sample sequence of steps that may be used to fabricate the airfoil of FIGS. 4-6, in accordance with a method of the present disclosure.

Turning now to FIG. 9, a series of steps that may be involved in fabricating the airfoil 72 of the present disclosure is depicted. It will be understood that a similar sequence of steps may be used to fabricate other types of gas turbine engine components having abrasive surfaces, such as the knife edge 80 or the cantilever vane 84 as disclosed herein. Beginning at block 90, the body portion 52 of the airfoil 72 is provided. At block 92, the tip 74 of the airfoil 72 is machined by EDM, which may involve both machining the desired length (l) of the airfoil 72 (at block 94), as well as machining the abrasive surface 54 (at block 96). At block 96, the parameters of the EDM process (e.g., voltage, current density, etc.) are tuned to provide a desired roughness/contact area of the abrasive surface 54. Once the EDM process is complete, the abrasive surface 54 on the tip 74 of the airfoil 72 is provided at block 98. Optionally, the hard coating 78 may be applied to the abrasive surface 54 to enhance the hardness and wear resistance of the surface 54.

For example, the hard coating 78 may be applied on the abrasive surface 54 by chemical vapor deposition (at block 100), or it may be formed by anodizing the abrasive surface 54 (at block 102) as explained above.

INDUSTRIAL APPLICABILITY

In general, it can therefore be seen that the technology disclosed herein has industrial applicability in a variety of settings including, but not limited to, gas turbine engines. The present disclosure provides a cost-effective and efficient method for producing abrasive surfaces on gas turbine engine components, such as blade tips. In particular, the technology disclosed herein implements EDM to both machine a gas turbine engine blade to length and provide an abrasive surface along the tip of the blade in a single step without masking the blade. This is in contrast with more expensive prior art methods which may use a grinding step to size the blade, followed by a thermal spray or plating process to apply an abrasive coating or plating on a heavily masked blade. Furthermore, as disclosed herein, the EDM parameters may be adjusted to tune the degree of roughness of the abrasive surface, as well as its contact area and contact temperature with an abradable material. In addition, the concepts of the present disclosure may be used to provide abrasive surfaces on a variety of other types of gas turbine engine components such as, but not limited to, blade tips, knife edge seals, cantilever vanes, and labyrinth seals. It is expected that the technology disclosed herein may find wide industrial applicability in a wide range of areas such as, but not limited to, aerospace applications and power generation applications.

What is claimed is:

1. A component for a gas turbine engine, comprising:
a body portion formed from a metallic material; and
an abrasive surface along at least one surface and edge of the body portion, wherein the abrasive surface comprises peaks and valleys and is configured to abrade an abradable material, the abrasive surface being formed from electrical discharge machining of the metallic material and exhibits a contact area with the abradable material of less than about 20%.

2. The component of claim 1, wherein the component is an airfoil, and the abrasive surface is along a tip of the airfoil.

3. The component of claim 2, wherein the abrasive surface has an average roughness of between about 0.01 millimeters and about 0.7 millimeters.

4. The component of claim 2, wherein the contact area is between about 5% and about 10%.

5. The component of claim 2, wherein the metallic material is selected from the group consisting of nickel alloy, an aluminum alloy, and an iron alloy.

6. The component of claim 2, further comprising a hard coating applied to the abrasive surface, the hard coating having a thickness less than the average roughness of the abrasive surface and comprising a ceramic material.

7. The component of claim 6, wherein the hard coating is applied by chemical vapor deposition.

8. The component of claim 7, wherein the hard coating is a titanium nitride coating.

9. The component of claim 6, wherein the metallic material includes aluminum, and wherein the hard coating is an aluminum oxide coating formed by anodizing the abrasive surface.

10. The component of claim 1, wherein the component is a knife edge of a knife edge seal, and wherein the abrasive surface forms a cutting edge of the knife edge.

11. The component of claim 1, wherein the component is a cantilever vane, and wherein the abrasive surface forms a radially inward facing edge of the cantilever vane.

12. An assembly for a gas turbine engine, comprising:
at least one of a fan section, a compressor section, or a turbine section; and
an airfoil in the at least one fan section, compressor section, or turbine section, the airfoil including
a body portion formed from a metallic material, and
a tip configured to abrade an abradable material, the tip having an abrasive surface and edge formed from electrical discharge machining of the metallic material and having peaks and valleys and having a contact area with the abradable material of less than about 20%.

13. A method for fabricating an airfoil for a gas turbine engine, comprising:
providing a body portion of the airfoil, the body portion having a tip and edge and formed from a metallic material; and
machining the tip and edge by electrode discharge machining to adjust a length of the airfoil and to form an abrasive surface on the tip having peaks and valleys and a contact area with an abradable material of less than about 20%.

14. The method of claim 13, further comprising adjusting at least one electrode discharge machining parameter to provide a desired roughness of the abrasive surface.

15. The method of claim 14, wherein the at least one parameter is selected from voltage and current density.

16. The method of claim 13, further comprising applying a hard coating to the abrasive surface, wherein the hard coating is a titanium nitride coating.

17. The method of claim 13, wherein the abrasive surface has an average roughness of between about 0.01 millimeters and about 0.7 millimeters.

18. The method of claim 13, further comprising anodizing the abrasive surface to provide a hard coating on the abrasive surface.

* * * * *